United States Patent [19]

Meyer

[11] 3,975,811
[45] Aug. 24, 1976

[54] AUTOTAB MACHINE

[75] Inventor: H. T. Meyer, Liverpool, N.Y.

[73] Assignee: General Staple Company, Inc., New York, N.Y.

[22] Filed: Oct. 30, 1974
(Under Rule 47)

[21] Appl. No.: 519,235

[52] U.S. Cl. ............................ 29/203 B; 29/203 DS
[51] Int. Cl.² ........................................ H05K 3/00
[58] Field of Search...... 29/203 B, 203 DT, 203 DS, 29/628, 208 R, 208 C, 208 F, 211 R; 221/70, 71; 227/114–116, 119, 135, 136

[56] References Cited
UNITED STATES PATENTS

| | | | |
|---|---|---|---|
| 3,605,237 | 9/1971 | Bakermans | 29/203 B |
| 3,641,646 | 2/1972 | Folk | 29/203 B X |
| 3,739,446 | 6/1973 | Long et al. | 29/203 B |
| 3,763,540 | 10/1973 | Long | 29/203 B |
| 3,797,091 | 3/1974 | Gavin | 29/203 B |
| 3,805,356 | 4/1974 | Serrano | 29/203 B |
| 3,820,218 | 6/1974 | Serrano | 29/203 B |

*Primary Examiner*—C.W. Lanham
*Assistant Examiner*—James R. Duzan
*Attorney, Agent, or Firm*—Lerner, David, Littenberg & Samuel

[57] ABSTRACT

An apparatus, method and supply strip is disclosed for inserting terminals into an apertured workpiece. The apparatus includes feeding means for sequentially advancing the supply strip formed of integrally connected preformed terminals toward a first station of the apparatus; grasping means for grasping the leading one of said terminals at said first station and for maintaining a grasp on said terminal until the terminal is inserted in the workpiece; shearing means for severing the leading one of said terminals from the remainder of said supply strip; and driving means operable to drive the grasping means toward the workpiece for insertion of the terminal carried thereby.

11 Claims, 6 Drawing Figures

AUTOTAB MACHINE

FIELD OF THE INVENTION

This invention relates to an apparatus, method, and supply strip for inserting elements such as electrical terminals into an apertured workpiece such as a printed circuit board, and more particularly relates to such an apparatus which operates from a continuous supply strip of integrally connected preformed terminals.

BACKGROUND OF THE INVENTION

In the fabrication of many electrical products, it is frequently necessary to establish a plurality of upstanding terminals on a substrate. For example, on printed circuit boards, it is necessary to establish terminal points to which external wiring can be secured. Various processes are known in the prior art for establishing such terminal points on printed circuit boards and other substrates, but the need has existed for reliable automated techniques which can simply, easily and rapidly establish terminals on substrates in an economic fashion.

SUMMARY OF THE INVENTION

The instant invention provides an apparatus and method for inserting terminals into a substrate or workpiece such as a printed circuit board which operates from a supply strip of integrally connected preformed terminals. The apparatus comprises feeding means sequentially advancing the supply strip toward a first station of the apparatus; grasping means for grasping the leading one of said terminals at said first station and for maintaining a grasp on said terminal until the terminal is inserted in the workpiece; shearing means for severing the leading one of said terminals from the remainder of the supply strip; and driving means operable to drive the grasping means toward the workpiece for insertion of the terminal carried thereby. The feeding, grasping, shearing and driving means are all operated in proper timed relationship by means of a main driven shaft with simple and reliable mechanical take-offs provided from said shaft to provide all the necessary functions.

As will be described in greater detail, the driving means includes a vertically reciprocating drive member which carries the grasping means at its lower end, The grasping means comprises first and second grasping plates normally biased apart to define a reception space for the leading one of the terminals as it is advanced into the grasping station by the feed means. Actuating means are provided for urging the grasping plates toward one another to grasp the leading one of the terminals therebetween. The timing is such that the leading terminal will be maintained in its grasped condition until the terminal has been inserted into the substrate properly located beneath the driving apparatus with the aid of a spring biased pilot pin.

In accordance with a further feature of the invention, as the grasping plates are urged toward one another to grasp the leading one of said terminals therebetween, the terminal is passed across a shearing edge of a fixed block to thereby sever the leading one of the terminals from the remainder of the supply strip. However, since the grasping function has occurred before the shearing function, there is no danger of the severed terminal being lost or misaligned after the severance takes place. Moreover, the desired alignment of the severed terminal is maintained during the downward travel of the aforementioned driving member since, as aforenoted, grasping plates firmly sandwich the severed terminal therebetween until the terminal has been inserted into the workpiece.

Other features of the invention and a detailed description thereof may be had by referring to the following detailed description in conjunction with the drawings hereof.

DETAILED DESCRIPTION

Figure 1:
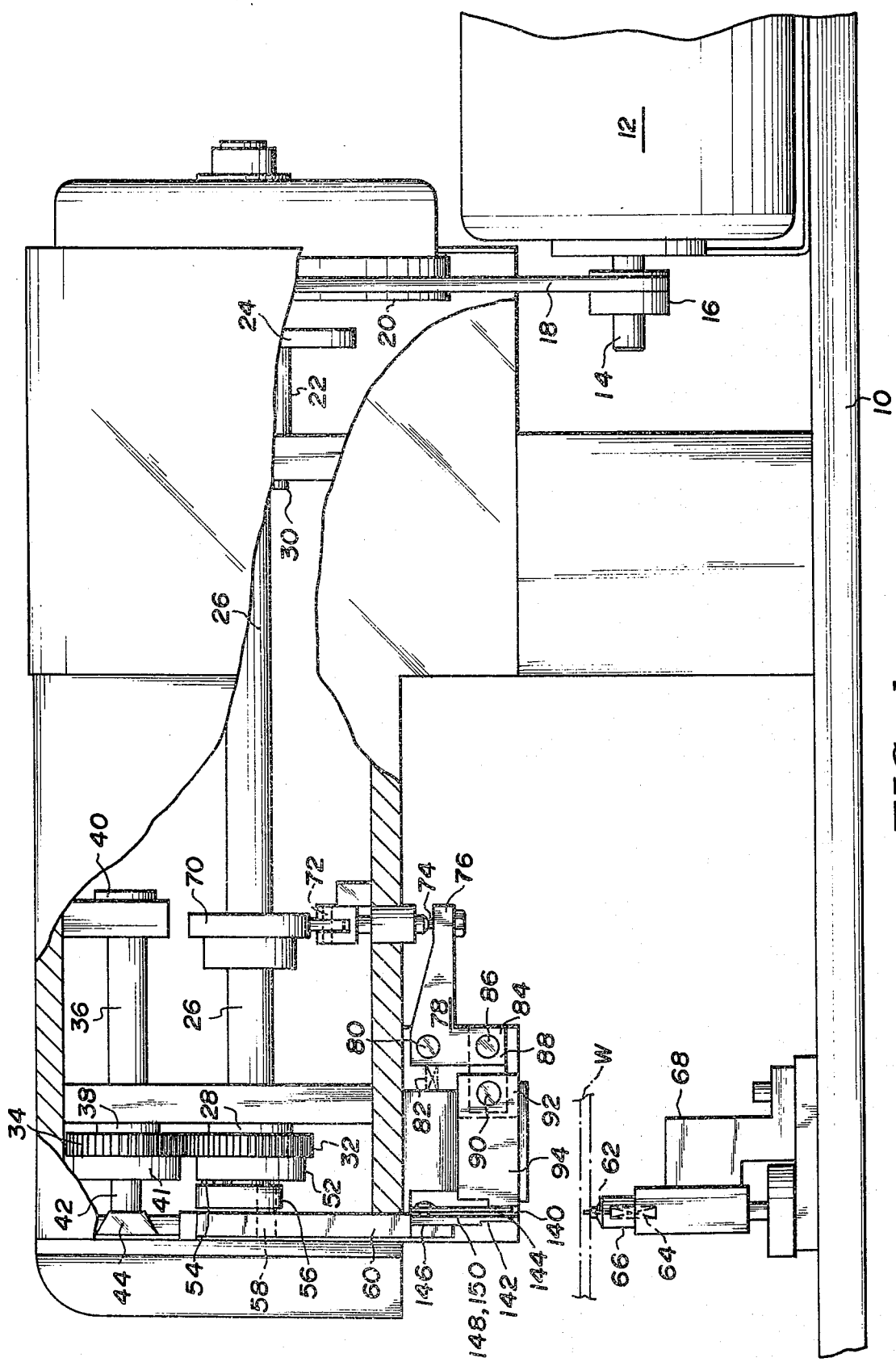
FIG. 1 is a side elevation of the machine of the instant invention.

As noted above, the instant invention is directed to an apparatus, method and supply strip for use therewith for inserting terminals into a workpiece such as a substrate or printed circuit board. As shown in the drawings, the supply strip 2 comprises a plurality of integrally connected terminals 4, each terminal including a flange portion 6, and integrally depending insertion portion 7 extending below the flange portion, and an integrally upstanding tab portion 8 disposed on the opposite side of the flange portion from the insertion portion. As seen in the figures, adjacent ones of the terminals are integrally connected to one another along the flange portions thereof. Although not shown in the drawings, it may be noted that the supply strip is pre-wound on a supply reel and sequentially fed to the apparatus by feeding mechanism broadly designated 50 to be described in greater detail. Broadly speaking, the apparatus sequentially advances the supply strip toward a first station, grasps the leading one of the terminals T at that station and maintains a grasp thereon until the terminal T is subsequently inserted into the workpiece, severs the leading one of the terminals from the remainder of the supply strip, and drives the grasped terminal into the workpiece. The workpiece is identified as W in FIGs. 1, 2 and 4C wherein there is also shown a completed operation in which a terminal T has been inserted therein.

The apparatus includes a frame generally indicated 10 within which is located motor 12. The output shaft 14 thereof carries pulley 16, the rotation of which is communicated by V-belt 18 to main pulley 20 carried on a shaft 22. Through a conventional clutch 24, the rotation of shaft 22 may be selectively imparted to main driven shaft 26 journaled for rotation by bearings 28 and 30 in the frame 10. Shaft 26 carries gear 32 which meshes with gear 34 keyed to a second driven shaft 36 journaled for rotation in frame 10 by bearings 38 and 40. At the leftmost end of shaft 36, there is carried a crank 41 having an upstanding pin 42 thereon. A link 44 is connected between pin 42 and a pin 46 carried on a longitudinally moveable slide member 48. The slide 48 actuates the feed mechanism 50 to be described in greater detail.

Left end of driven shaft 26 carries a crank 52 having an upstanding pin 54 thereon. A link 56 connects pin 54 to a pin 58 rearwardly projecting from a vertically reciprocatable inserting member 60. As will be explained in greater detail, the downward movement of the inserting member 60 is employed to insert the terminal member into the work piece W which has been properly centered by the operator with the aid of a centering pin 62 spring biased toward a vertical position by a compression spring 64 housed within an anvil 66 supported on the frame through support mechanism broadly designated 68 in FIG. 1.

Keyed for rotation with driven shaft 26 is an eccentric cam 70, the cam surface of which controls the downward stroke of a follower 72, the lower end 74 of which projects through the frame 10 and is engaged with the rightmost end 76 of a bell crank lever 78 pivoted to the frame at 80. The bell crank lever 78 is normally biased counterclockwise around its pivot point 80 by a compression spring 82. The end 84 of bell crank lever 78 carries a pin 86 which receives one end of a link 88, the opposite end of which is received by a pin 90 carried on the rear portion 92 of a drive block 94. In a manner to be further described, the forward motion of the drive block 94 generated by the eccentricity of the cam 70 will cause the grasping and shearing of a single terminal from the supply strip which has been advanced into proper position by the feeding mechanism. As will be further apparent, once the terminal has been sheared from the supply strip, the downward stroke of the insertion member 60 will cause the terminal to be inserted in the work piece W. It should be also added, that it is a significant feature of the instant invention that during the downward travel of the insertion member 60, the severed terminal will be clamped and held in proper position at all times.

Figure 2:
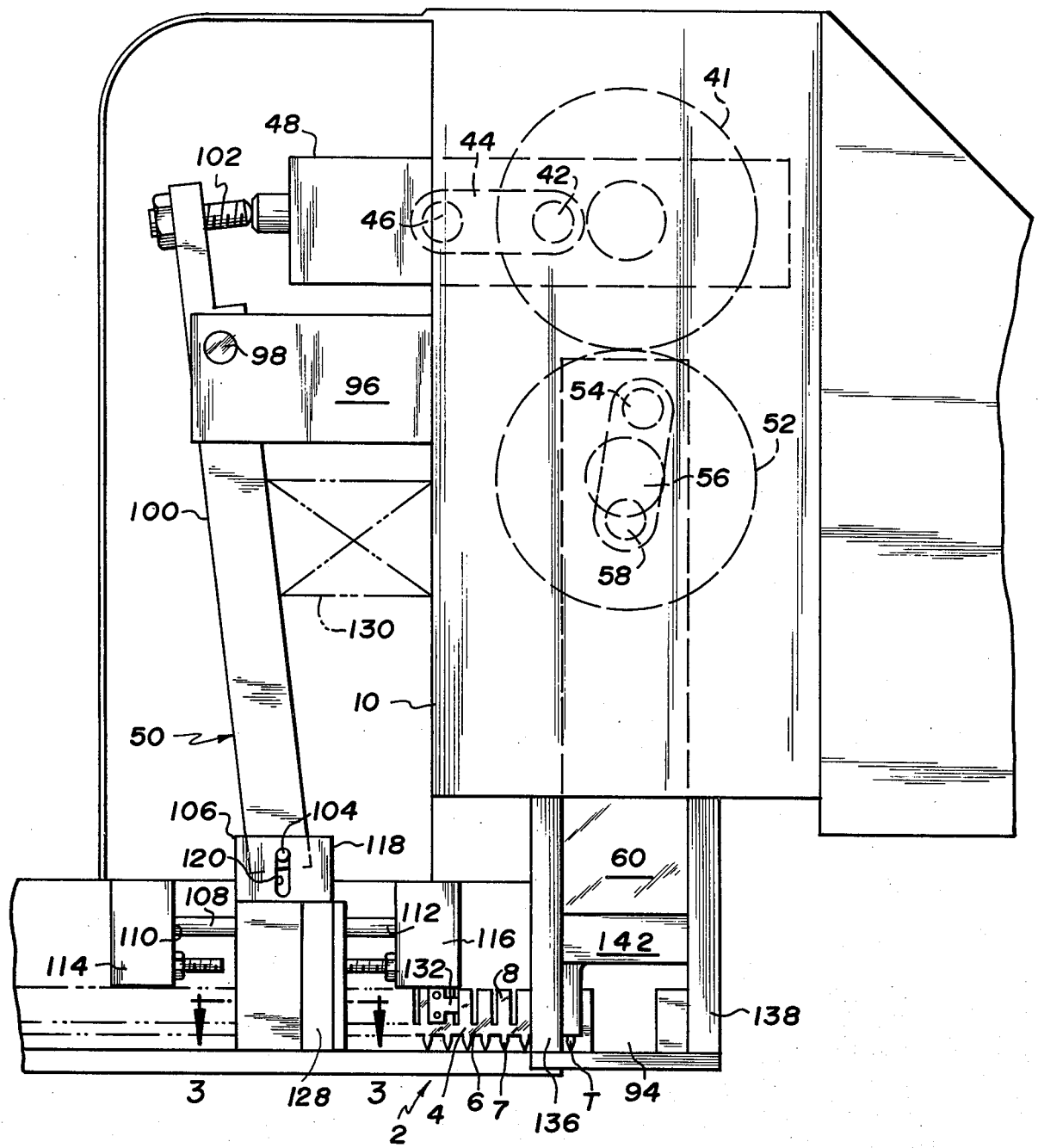
FIG. 2 is a front elevation of the machine of the instant invention.
Figure 2:
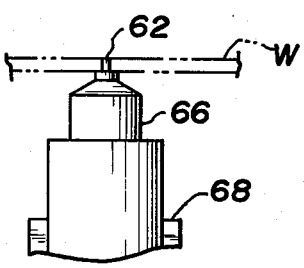

Turning to FIG. 2, there is shown in detail the feed mechanism 50 of the instant invention. An extension 96 secured to the frame 10 carries a pivot pin 98 which passes through drive rod 100 and is thereby mounted for rotation about pin 98. It will be apparent that when slide 48 moves to the left in FIG. 2, and engages adjustment screw 102 carried by drive rod 100, the rod will rotate counterclockwise about its fulcrum 98 such that a pin 104 carried at its lower end will rotate counterclockwise with respect to the fulcrum 98.

A feed block 106 is guided for longitudinal motion by a guide bar 108 carried at respective ends 110 and 112 by blocks 114 and 116. An upper portion 118 of the feed block 106 has a vertically elongated slot 120 which receives the aforementioned pin 104 carried on the drive rod 108. Thus, it will be apparent that counterclockwise motion of the pin 104 will cause the feed block 106 to move lineally to the right in FIG. 2 guided in its motion by the aforementioned guide bar 108.

Figure 3:
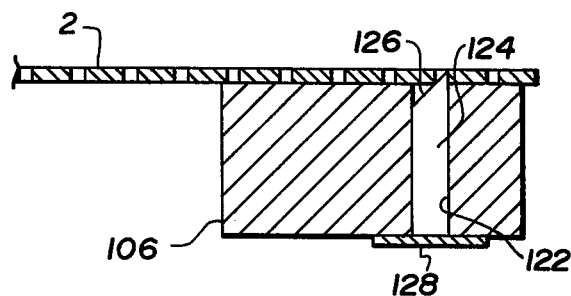
FIG. 3 is a longitudinal cross-section taken along the arrows 3—3 of FIG. 2.

As best seen in FIG. 3, feed block 106 has a passageway 122 (passing from front to rear in FIG. 3) in which is inserted a drive pawl 124, the forward wedge-shaped portion 126 of which enters the slots between the adjacent terminals on the continuous preformed supply strip. The pawl 124 is biased inwardly toward the supply strip by a leaf-spring 128 which engages the rear of the drive pawl 124.

Thus, as the feed block 106 travels to the right in FIG. 2, the drive pawl 124 advances the next terminal into the grasping and cut-off section to be described in detail below. A compression return spring 130 is provided to return the drive rod 100 and the feed block 106 to its initial position. During the return travel, a spring biased anti-rearward travel check 132 prevents rearward travel of the supply strip back toward the supply roll (not shown for the sake of drawing clarity).

Figure 4A:
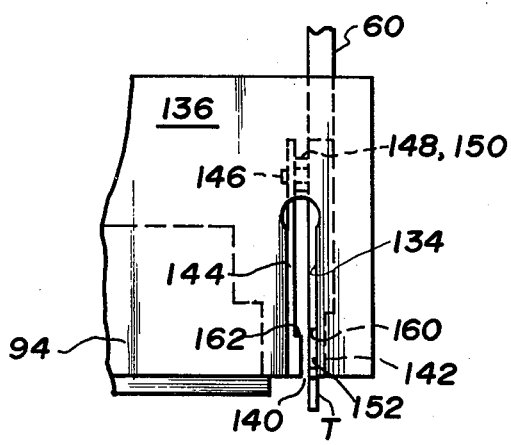
FIGS. 4A, 4B and 4C are partially schematic side views illustrating the clamp, shearing and driving function performed by a portion of the machine.
Figure 4B:
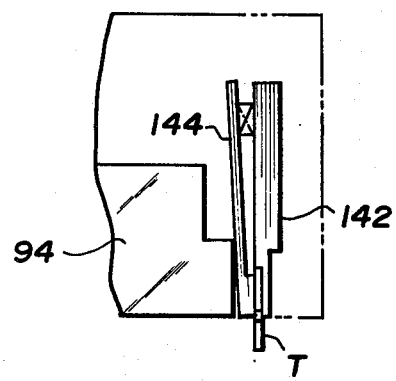
Figure 4C:
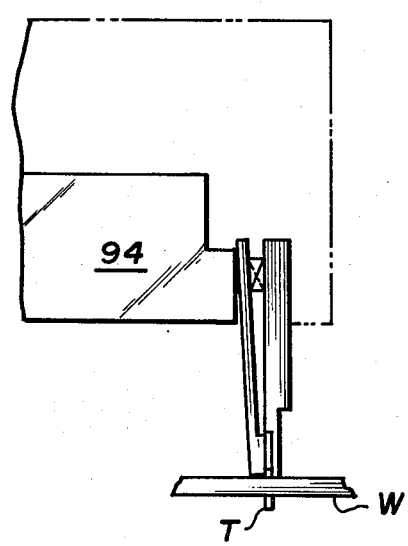

As best seen in FIGS. 4A-4C, the terminal strip is sequentially fed into the grasping and cutting station by passing through a slot 134 provided in one of the end plates 136, 138 which houses the reciprocating drive block 94. After passing through the slot 134, the terminal which will be subsequently inserted in the workpiece W enters space 140 defined between grasping plates 142 and 144 carried by insertion drive member 60. As best seen in FIG. 4A, the rearmost grasping plate 144 is carried on guide pin 146 and normally biased to its rearmost position by compression springs 148, 150. Thus, the springs 148 and 150, normally maintain the space 140 between the grasping plates 142 and 144, thereby permitting the entry of the incoming terminal.

As also seen most clearly in FIG. 4A, the grasping plates 142 and 144 are so positioned that a shearing edge 152 defining the slot 134 is disposed forward of the rear grasping plate 144 but to the rear of forward grasping plate 142.

Thus, when the drive block 94 moves forward, as explained above, the first thing to occur is that the rear grasping plate 144 begins to move toward the front of the machine grasping the terminal from behind. As the forward motion of the rear grasping plate 144 continues, the rear grasping plate 144, together with the terminal grasped thereby, will be pushed forward past the shearing edge 152 which defines the aforementioned entry slot 134. At this time, the terminal to be subsequently inserted has been sheared from the remainder of the supply strip, while at the same time, it is still held in firmly grasped position between the grasping plates 142 and 144.

Continuing with the operation of the machine, the timing is such (by virtue of the eccentric cam 70) that as the insertion ram 60 begins to descend, the drive block 94 stays in its forwardmost position maintaining the rear grasping plate 144 in its grasping position. At the point in the downward travel of the insertion member 60 that the terminal is inserted in the workpiece W, the drive block 94 retracts, and the bias of springs 148 and 150 returns the rear grasping plate 144 toward its rearmost position completely freeing the terminal such that it remains in the workpiece with no upward grasping force applied thereto as the insertion ram begins its upward travel.

As also seen in FIG. 4C, the forward grasping plate 142 and rearward grasping plate 144 include stepped shoulder regions 160 and 162, respectively. Shoulder portion 160 accommodates the rearward grasping plate 144 when rear grasping plate 144 is moved forward under the influence of driving member 94. The recess shoulder surface 160 also establishes a positive driving action on the top of the terminal T, especially important when the lower portion of the terminal T encounters friction as it enters the hole in the workpiece.

After the terminal has been inserted in the workpiece W and the insertion member 60 begins its upward travel, the above-described steps occur in the reverse direction to recycle the machine for the next actuation.

What is claimed:

1. Apparatus for inserting terminals into a workpiece; said apparatus comprising feeding means for sequentially advancing a supply strip of integrally connected preformed terminals toward a first station of said apparatus;

grasping means for grasping the leading one of said terminals at said first station and for maintaining a grasp on said one of said terminals until said terminal is inserted in said workpiece;

shearing means for severing said leading one of said terminals from the remainder of said supply strip; and driving means operable to drive said grasping means toward said workpiece for insertion of said terminal therein;

wherein said grasping means solely comprises first and second grasping plates normally biased apart to define a reception space for said leading one of said terminals and further comprising actuating means for urging said grasping plates toward one another to grasp said leading one of said terminals therebetween for a preselected period of time; and wherein said shearing means comprises a shearing edge passed by one of said grasping plates as they are urged toward one another by said actuating means.

2. The apparatus of claim 1 wherein said driving means includes a vertically reciprocating drive member; and said grasping means is carried on the lower end of said drive member.

3. The apparatus of claim 1 wherein the inner surfaces of said grasping plates have complementary stepped shoulder regions for closely accommodating one another and for establishing a driving surface for engagement with the top of said terminal.

4. The apparatus of claim 1 and further comprising a rotatable driven shaft; crank means connected between said driven shaft and said vertically reciprocating drive member; and wherein said actuating means includes an eccentric cam carried by said driven shaft for rotation therewith and cam following linkage means responsive to the rotation of said eccentric cam for urging said grasping plates toward one another for said preselected period of time.

5. The apparatus of claim 2 wherein said feeding means comprises a feed block mounted for reciprocating motion in a path of travel transverse to the path of travel of said drive member, said feed block carrying a pawl which engages said supply strip to advance same upon movement of said feed block toward said first station; and feed block drive means for moving said feed block toward said station.

6. The apparatus of claim 5 wherein said pawl is normally biased toward said supply strip so as to enter recesses formed in said supply strip intermediate adjacent preformed terminals.

7. The apparatus of claim 5 and further comprising a first rotatable driven shaft; first crank means connected between said first driven shaft and said vertically reciprocating drive member; a second rotatable driven shaft geared to said first rotatable driven shaft for simultaneous rotation therewith; a slide member mounted for reciprocating motion in a path of travel parallel to the path of motion of said feed block; second crank means connected between said second rotatable driven shaft and said slide member; and wherein said feed block drive means comprises a drive link mounted for rotation about a fixed pivot point, one end of said drive link connected to said feed block, the other end of said drive link drivingly engaged by said slide member as said slide member moves in its reciprocating path of movement in response to rotation of said second driven shaft.

8. The apparatus of claim 7 wherein said feed block includes a vertically elongated slot which receives a pin carried by said one end of said drive link to accomodate arcuate travel of said drive link while said feed block travels in a linear path of trave.

9. The apparatus of claim 1 wherein said feeding means comprises a feed block mounted for reciprocating motion in a path of travel transverse to the path of travel of said drive member, said feed block carrying a pawl which engages said supply strip to advance same upon movement of said feed block toward said first station; and feed block drive means for moving said feed block toward said station; and further comprising a first rotatable driven shaft; first crank means connected between said first driven shaft and said vertically reciprocating drive member; a second rotatable driven shaft geared to said first rotatable driven shaft for simultaneous rotation therewith; a slide member mounted for reciprocating motion in a path of travel parallel to the path of motion of said feed block; second crank means connected between said second rotatable driven shaft and said slide member; and wherein said feed block drive means comprises a drive link mounted for rotation about a fixed pivot point, one end of said drive link connected to said feed block, the other end of said drive link drivingly engaged by said slide member as said slide member moves in its reciprocating path of movement in response to rotation of said second driven shaft.

10. The apparatus of claim 1 wherein said feeding means comprises a feed block mounted for reciprocating motion in a path of travel transverse to the path of travel of said drive member, said feed block carrying a pawl which engages said supply strip to advance same upon movement of said feed block toward said first station; and feed block drive means for moving said feed block toward said station; and further comprising a first rotatable driven shaft; first crank means connected between said first driven shaft and said vertically reciprocating drive member; a second rotatable driven shaft geared to said first rotatable driven shaft for simultaneous rotation therewith; a slide member mounted for reciprocating motion in a path of travel parallel to the path of motion of said feed block; second crank means connected between said second rotatable driven shaft and said slide member; and wherein said feed block drive means comprises a drive link mounted for rotation about a fixed pivot point, one end of said drive link connected to said feed block, the other end of said drive link drivingly engaged by said slide member as said slide member moves in its reciprocating path of movement in response to rotation of said second driven shaft.

11. The apparatus of claim 1 wherein said shearing means comprises a slotted guide block having a shearing edge passed by one of said grasping plates as they are urged toward one another by said actuating means.

* * * * *